United States Patent
Becker et al.

(10) Patent No.: US 11,975,343 B1
(45) Date of Patent: May 7, 2024

(54) AUTOMATED PRESSURE CONTROL SYSTEM AND METHOD FOR A CLEANER

(71) Applicant: Illinois Tool Works Inc., Glenview, IL (US)

(72) Inventors: Eric Wayne Becker, Phillipsburg, MO (US); Michael Brainard, Lebanon, MO (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 17/977,448

(22) Filed: Oct. 31, 2022

(51) Int. Cl.
*B05B 12/08* (2006.01)
*B08B 3/02* (2006.01)
*B08B 13/00* (2006.01)
*H05K 3/22* (2006.01)

(52) U.S. Cl.
CPC ............ *B05B 12/085* (2013.01); *B08B 3/022* (2013.01); *B08B 13/00* (2013.01); *H05K 3/22* (2013.01); *H05K 2203/074* (2013.01); *H05K 2203/075* (2013.01); *H05K 2203/0776* (2013.01)

(58) Field of Classification Search
CPC ....... B05B 12/085; B08B 3/022; B08B 13/00; H05K 3/22; H05K 2203/074; H05K 2203/075; H05K 2203/0776
See application file for complete search history.

(56) References Cited

U.S. PATENT DOCUMENTS

| | | | | |
|---|---|---|---|---|
| 5,226,962 A | * | 7/1993 | Burke | B05B 7/24 118/74 |
| 2002/0192391 A1 | * | 12/2002 | Wada | B08B 7/0035 427/508 |
| 2016/0059380 A1 | * | 3/2016 | Yamaguchi | B08B 3/02 451/72 |
| 2023/0205235 A1 | * | 6/2023 | Kim | H01L 21/67288 700/283 |

FOREIGN PATENT DOCUMENTS

| | | | | |
|---|---|---|---|---|
| CN | 104080948 A | * | 10/2014 | ............ C23C 24/02 |
| CN | 212625508 U | * | 2/2021 | |

(Continued)

OTHER PUBLICATIONS

Machine Translation of WO-2022009661-A1 to Amai, Jan. 2022. (Year: 2022).*

(Continued)

*Primary Examiner* — Benjamin L Osterhout
(74) *Attorney, Agent, or Firm* — Lando & Anastasi, LLP

(57) ABSTRACT

A cleaning apparatus includes at least one cleaning module configured to treat electronic substrates and a conveyor system configured to transport the electronic substrates through the at least one cleaning module. The at least one cleaning module includes a fluid management system having a manifold coupled to a source of fluid. The manifold includes at least one outlet. The at least one cleaning module further includes an automatic valve coupled to the at least one outlet and to a conduit leading to one or more first spray nozzles and a pressure sensor coupled to the automatic (Continued)

valve. The pressure sensor is configured to measure pressure of fluid flowing through the conduit. The automatic valve is configured to adjust the flow of fluid through the conduit based on the pressure measured by the pressure sensor.

20 Claims, 6 Drawing Sheets

(56) References Cited

FOREIGN PATENT DOCUMENTS

| | | | | | |
|---|---|---|---|---|---|
| CN | 113414165 | A | * | 9/2021 | |
| JP | 2000173963 | A | * | 6/2000 | |
| KR | 20070114875 | A | * | 12/2007 | |
| WO | WO-2022009661 | A1 | * | 1/2022 | ............ B01D 29/56 |

OTHER PUBLICATIONS

Machine Translation of CN-212625508-U to Cheng, Feb. 2021. (Year: 2021).*
Machine Translation of CN-113414165-A to Yang, Sep. 2021. (Year: 2021).*
Machine Translation of CN-104080948-A to Doyle, Oct. 2014 (Year: 2014).*
Machine Translation of JP-2000173963-A to Himuro, Jun. 2000. (Year: 2000).*
Machine Translation of KR-20070114875-A to Chung et al., Dec. 2007. (Year: 2007).*

* cited by examiner

AUTOMATED PRESSURE CONTROL SYSTEM AND METHOD FOR A CLEANER

BACKGROUND OF THE DISCLOSURE

1. Field of the Disclosure

This application relates generally to an apparatus for cleaning electronic substrates, including printed circuit boards and semiconductor product assemblies, and, more particularly, to a system and a method to automatically control fluid pressure within the cleaning apparatus.

2. Discussion of Related Art

Various types of liquid cleaning apparatus, often referred to as cleaners, are used to clean electronic substrates for removal of contaminates, such as flux residues, resins and the like. These contaminates remain on the electronic substrate from the soldering process.

The soldering process has recently advanced in two significant ways—the transition from tin-lead solder to lead-free materials and the reduction in the size of electronic substrate and the associated increase in the density of smaller, low-profile components. These new soldering materials have increased temperature requirements for soldering and are typically formulated to have higher flux content by weight. The combination of lead-free processes and new electronic substrate designs are demanding more time and energy to meet industry cleanliness standards.

Cleaners are used to clean unwanted materials left by the soldering process from the electronic substrate. Such cleaners are equipped with wash and rinse modules to clean the electronic substrate. Managing cleaning fluid with the wash and rinse modules is a challenge, especially managing fluid pressure within respective modules. Typical fluid management approaches involve manually manipulating pressure valves provided within the system.

SUMMARY OF THE DISCLOSURE

One aspect of the present disclosure is directed to a cleaning apparatus for cleaning electronic substrates including printed circuit boards and semiconductor product assemblies. In one embodiment, the cleaning apparatus comprises at least one cleaning module configured to treat electronic substrates and a conveyor system configured to transport the electronic substrates through the at least one cleaning module. The at least one cleaning module includes a fluid management system having a manifold coupled to a source of fluid. The manifold includes at least one outlet. The at least one cleaning module further includes an automatic valve coupled to the at least one outlet and to a conduit leading to one or more first spray nozzles and a pressure sensor coupled to the automatic valve. The pressure sensor is configured to measure pressure of fluid flowing through the conduit. The automatic valve is configured to adjust the flow of fluid through the conduit based on the pressure measured by the pressure sensor.

Embodiments of the cleaning apparatus further may include a controller coupled to the automatic valve and the pressure sensor. The manifold may include at least two outlets, a first outlet and a second outlet. The fluid management system further may include a first automatic valve coupled to the first outlet and to a first conduit leading to one or more first spray nozzles and a second automatic valve coupled to the second outlet and to a second conduit leading to one or more second spray nozzles. The fluid management system further may include a first pressure sensor coupled to the first automatic valve and a second sensor coupled to the second automatic valve. The first pressure sensor may be configured to measure pressure of fluid flowing through the first conduit and the second pressure sensor may be configured to measure pressure of fluid flowing through the second conduit. The controller may be configured to control the first and second automatic valves to address a pressure drop detected by one of the first pressure sensor and the second pressure sensor. A pressure drop detected by the first pressure sensor may result in a closing or partially closing of the second automatic valve.

Another aspect of the present disclosure is directed to a cleaning apparatus for cleaning electronic substrates including printed circuit boards and semiconductor product assemblies. In one embodiment, the cleaning apparatus comprises at least one cleaning module configured to treat electronic substrates and a conveyor system configured to transport the electronic substrates through the at least one cleaning module. The at least one cleaning module includes a fluid management system having a manifold coupled to a source of fluid. The manifold includes at least two outlets, a first outlet and a second outlet. The fluid management system further includes a first automatic valve coupled to the first outlet and to a first conduit leading to one or more first spray nozzles and a second automatic valve coupled to the second outlet and to a second conduit leading to one or more second spray nozzles. The fluid management system further includes a first pressure sensor coupled to the first automatic valve and a second sensor coupled to the second automatic valve. The first pressure sensor is configured to measure pressure of fluid flowing through the first conduit and the second pressure sensor is configured to measure pressure of fluid flowing through the second conduit. At least one of the first automatic valve and the second automatic valve is configured to adjust the flow of fluid through its respective conduit based on the pressure measured by one of the first pressure sensor and the second pressure sensor.

Embodiments of the cleaning apparatus further may include a controller coupled to the first and second automatic valves and the first and second pressure sensors. The controller may be configured to control the automatic valves to address a pressure drop detected by one of the first pressure sensor and the second pressure sensor. A pressure drop detected by the first pressure sensor may result in a closing or partially closing of the second automatic valve.

Yet another aspect of the present disclosure is directed to a method for cleaning electronic substrates with a cleaning apparatus. In one embodiment, the method comprises: transporting an electronic substrate by the conveyor system through the at least one cleaning module; performing a cleaning operation with the at least one cleaning module; detecting a pressure drop of one of the first conduit and the second conduit; and adjusting one of at least two automatic valves associated with the first conduit and the second conduit, respectively, to address the pressure drop.

Another aspect of the present disclosure is directed to a fluid management system of a cleaning module of a cleaning apparatus to clean electronic substrates including printed circuit boards and semiconductor product assemblies. In one embodiment, the fluid management system comprises a manifold coupled to a source of fluid. The manifold includes at least one outlet. The fluid management system further comprises an automatic valve coupled to the at least one outlet and to a conduit leading to one or more first spray nozzles and a pressure sensor coupled to the automatic valve. The pressure sensor is configured to measure pressure of fluid flowing through the conduit. The automatic valve is configured to adjust the flow of fluid through the conduit based on the pressure measured by the pressure sensor.

Embodiments of the fluid management system further may include coupling a controller to the automatic valve and the pressure sensor. The manifold may include at least two outlets, a first outlet and a second outlet. The fluid management system further may include a first automatic valve coupled to the first outlet and to a first conduit leading to one or more first spray nozzles and a second automatic valve coupled to the second outlet and to a second conduit leading to one or more second spray nozzles. The fluid management system further may include a first pressure sensor coupled to the first automatic valve and a second sensor coupled to the second automatic valve. The first pressure sensor may be configured to measure pressure of fluid flowing through the first conduit and the second pressure sensor may be configured to measure pressure of fluid flowing through the second conduit. The controller may be configured to control the first and second automatic valves to address a pressure drop detected by one of the first pressure sensor and the second pressure sensor. A pressure drop detected by the first pressure sensor may result in a closing or partial closing of the second automatic valve. The fluid management system further may include an overflow valve evacuate fluid from the manifold in the event of an overflow situation.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
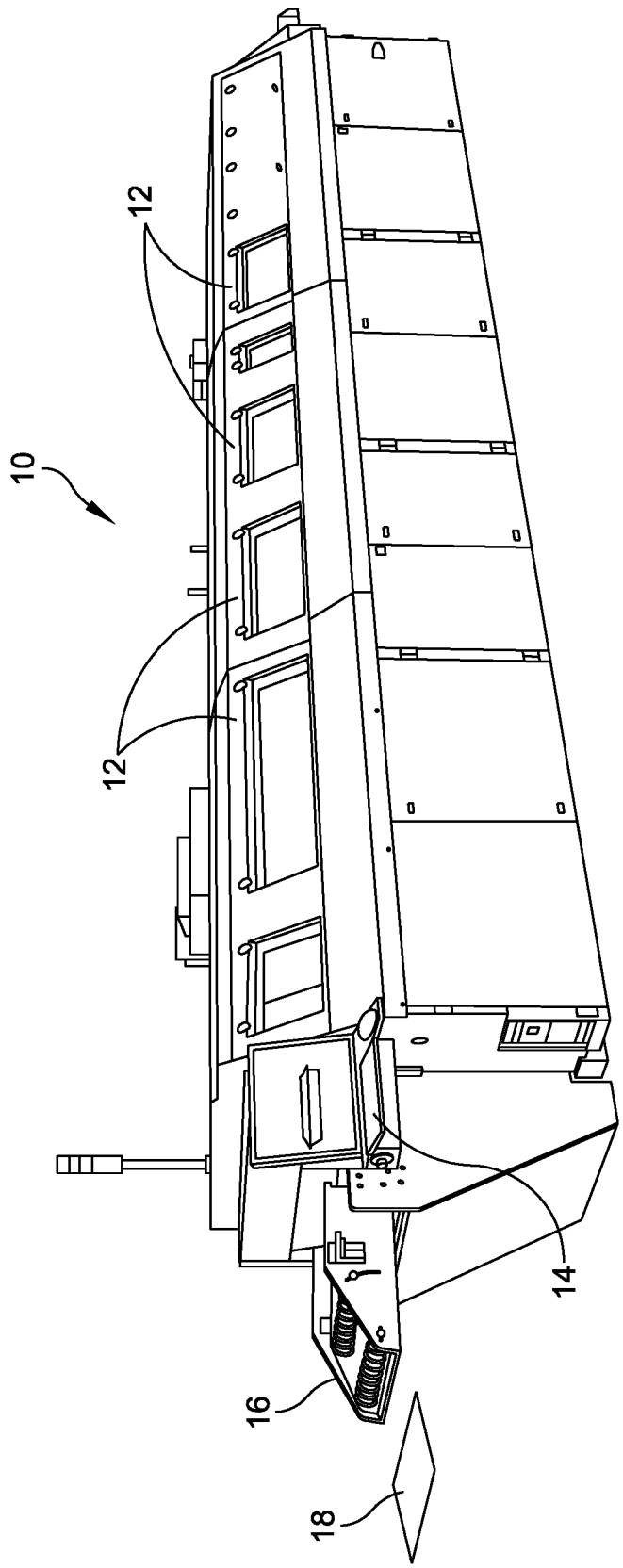
FIG. 1 is a perspective view of an electronic substrate cleaning apparatus.

Solder paste is routinely used in the assembly of electronic substrates, including printed circuit boards and semiconductor product assemblies, where the solder paste is used to join electronic components to the substrate. Solder paste includes solder for joint formation and flux for preparing metal surfaces for solder attachment. The solder paste may be deposited onto the metal surfaces (e.g., electronic pads) provided on the electronic substrate by using any number of application methods. In one example, a stencil printer may employ a squeegee to force the solder paste through a metallic stencil laid over an exposed surface of the electronic substrate. In another example, a dispenser may dispense solder paste material onto specific areas of the electronic substrate. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the electronic substrate. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used. Another process to attach components onto electronic substrates is a wave soldering process.

In the solder, the flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochlorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

As mentioned above, the soldering processes described herein leave unwanted contaminates on the electronic substrate, which must be cleaned prior to being released for use. Disclosed herein is an inline cleaning process to remove undesired contaminations from manufacturing processes. In one embodiment, a fluid management system is employed to manage fluid used to clean and rinse electronic substrates as they pass through each module of the cleaning apparatus. The fluid management system includes a primary manifold and a series of valves and transducers to manage pressure of fluid within the system. Unlike prior approaches, in which an operator must manually change the fluid pressure within the system, the fluid management system is configured with a closed loop approach to automatically control pressure valves provided within the system to control fluid pressure within the system. An unwanted pressure drop in one area of the fluid management system causes a pressure increase in another part of the system. The fluid management system is configured to provide closed loop feedback of pressure throughout the system to immediately address unwanted pressure drops.

It is to be appreciated that embodiments of the systems and apparatuses discussed herein are not limited in application to the details of construction and the arrangement of components set forth in the following description or illustrated in the accompanying drawings. The systems and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Referring now to the drawings, and more particularly to FIG. 1, an electronic substrate cleaning apparatus is generally indicated at 10. As shown, the cleaning apparatus 10 is an elongate structure that includes several modules, each indicated at 12, to clean and process electronic substrates. In one exemplary embodiment, the cleaning apparatus 10 includes, one or more of the following modules: a pre-wash module, a wash module, a pre-rinse module, a rinse module, and a dry module. A control module having a user interface together indicated at 14 provides an operator the ability to program and monitor the cleaning apparatus 10.

The cleaning apparatus 10 further includes an elongate conveyor 16 that is configured to transport electronic substrates, e.g., electronic substrate 18, through the modules 12 of the cleaning apparatus. As mentioned above, the electronic substrate 18 can include printed circuit boards and semiconductor product assemblies. The conveyor 16 is designed to securely hold the electronic substrate 18 during the sometimes rigorous cleaning processes. Sometimes trays are used to support the items being transported through the cleaning apparatus 10 for cleaning. Embodiments of the present disclosure are directed to a fluid management system that is used to manage wash and rinse fluid used in the pre-wash, wash, pre-rinse and rinse modules.

Figure 2:
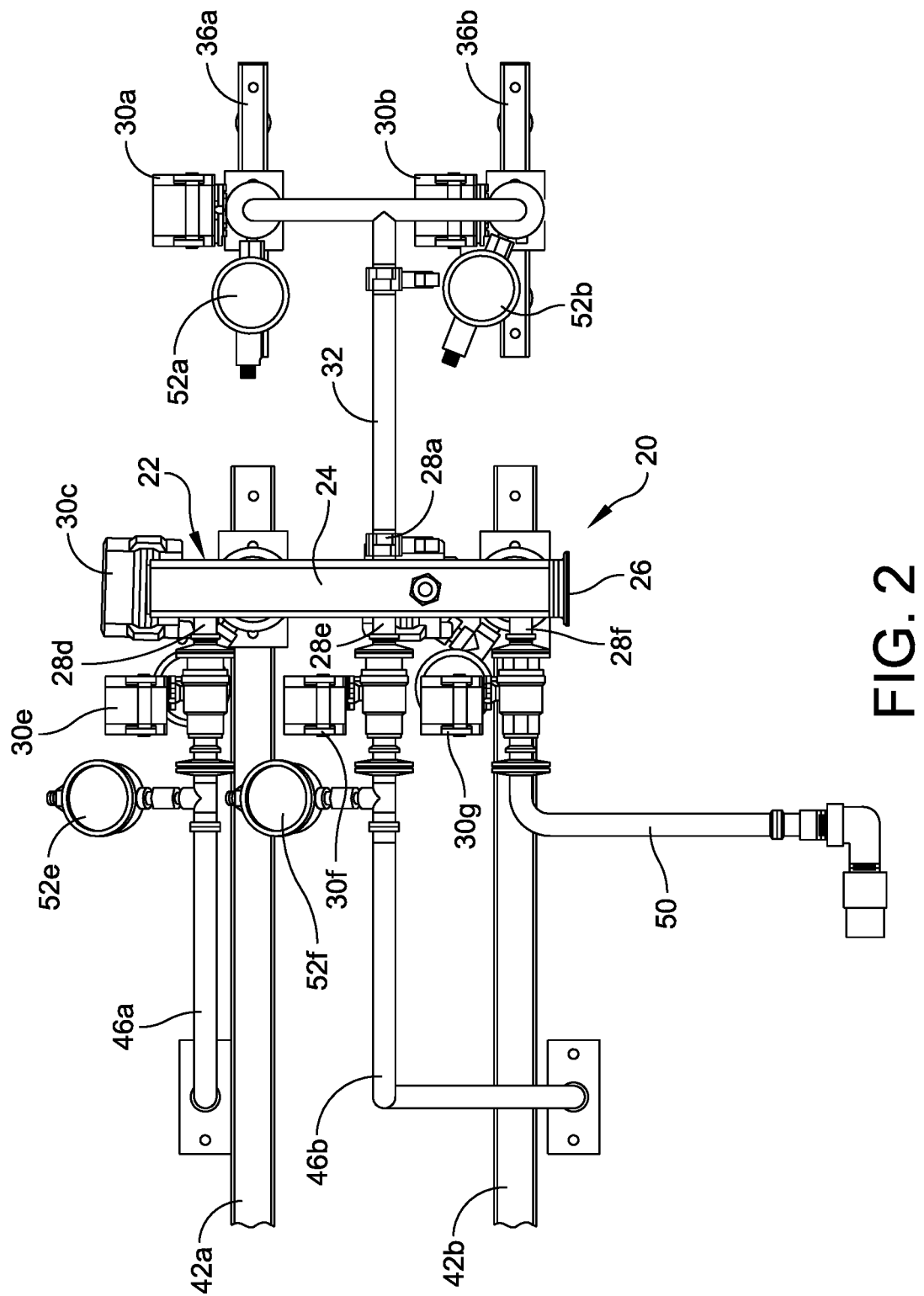
FIG. 2 is an elevational view of a portion of a fluid management system used to deliver fluid under pressure to spray nozzles associated with the system.
Figure 3:
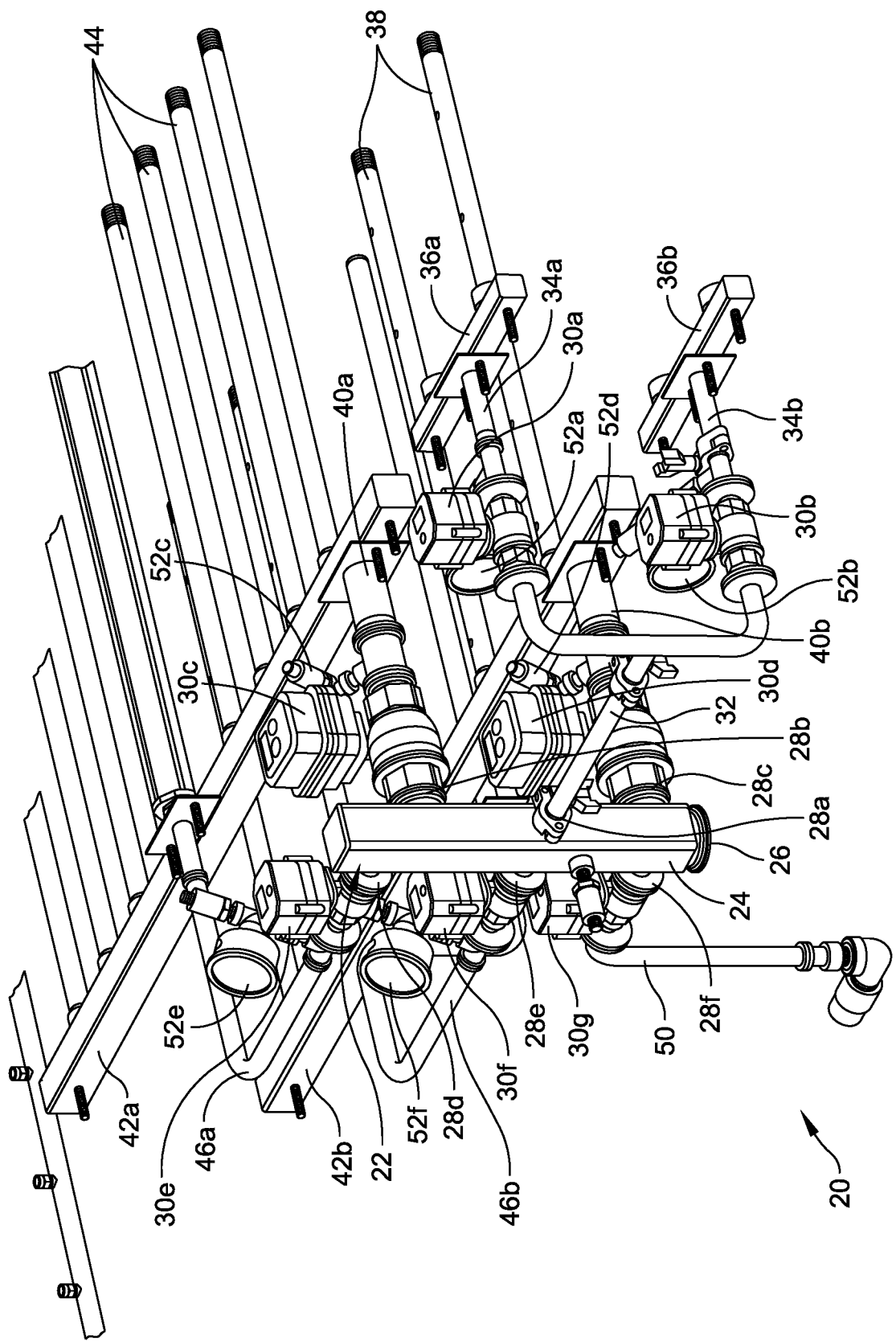
FIG. 3 is a perspective view of the portion of the fluid management system shown in FIG. 2.

Referring to FIGS. 2-6, and more particularly to FIGS. 2 and 3, the cleaning apparatus 10 includes a fluid management system, generally indicated at 20. As described above, each of the pre-wash module, the wash module, the pre-rinse module and the rinse module includes a fluid management system similar to or identical to the fluid management system 20 shown and describe herein. Differences in the fluid management system 20 may lie in the layout of the fluid management system as well as the number of components used to assemble the fluid management system. For example, as will be described in greater detail below, the fluid management system 20 may include a variety of manifolds, conduits and spray nozzles used to spray fluid at the item passing through the module. The fluid management system 20 shown and described herein may be incorporated within the modules 12 of the cleaning apparatus 10 with very little modifications and design changes.

As shown, the fluid management system 20 includes a primary manifold, generally indicated at 22, which as described in greater detail below, is connected to a source of fluid. Specifically, the primary manifold 22 includes a manifold body 24 having a lower end opening 26 connected to a source of fluid, and several ports or nipples, indicated at 28a, 28b, 28c, 28d, 28e, 28f, that are provided to distribute fluid. In the shown embodiment, the primary manifold 22 includes six ports 28a, 28b, 28c, 28d, 28e, 28f provided along a length of the manifold body 24 on different sides of the manifold body. In the shown example, port 28a is provided on one side of the manifold body 24, ports 28b, 28c, are provided on an adjacent side of the manifold body, and ports 28d, 28e, 28f are provided on an opposite side of the manifold body. The number and location of the ports may be modified depending on the number of spray components provided as part of the fluid distribution system.

The fluid management system 20 further includes valves, indicated at 30a, 30b, 30c, 30d, 30e, 30f, 30g, to control the flow of fluid. As shown, port 28a is connected by a conduit 32 to valves 30a, 30b, port 28b is connected to 30c, port 28c is connected to valve 30d, port 28d is connected valve 30e, port 20e is connected to valve 30f, and port 28f is connected to valve 30g. The valves 30a, 30b, 30c, 30d, 30e, 30f, 30g may each include a flow control valve, which is designed to regulate the amount of fluid passing through the valve. Flow control valves may include actuators and positioners to regulate the amount of fluid passing through the valves. Examples of the types of valves that may be used include globe valves, diaphragm valves, ball valves and butterfly valves. Flow control valves can also work with hydraulic actuators, which respond to changes in pressure or flow to open and control the valves.

Each valve is connected to a conduit, which leads to one or more spray nozzles. Specifically, valve 30a is connected to a conduit 34a, which in turn is connected to a secondary manifold 36a. Connected to the secondary manifold 36a are two spray bars, each indicated at 38, which each include a number of nozzles or openings to spray fluid. Similarly, the valve 30b is connected to a conduit 34b, which is connected to a secondary manifold 36b. The spray bar or nozzle is not shown, but may be configured to include spray bars 38, similar to secondary manifold 36a.

Valve 30c is connected to a conduit 40a, which is connected to an elongate secondary manifold 42a. Connected to the elongate secondary manifold 42a are several spray bars, each indicated at 44. As shown, eight spray bars 44 are provided, with spray bars 44 being longer in length and including more nozzles than spray bars 38. Similarly, valve 30d is connected to a conduit 40b, which is connected to an elongate secondary manifold 42b. Connected to the elongate secondary manifold 42b are several spray bars, each indicated at 44. As with secondary manifold 42a, there are eight spray bars 44 secured to secondary manifold 42b.

Valve 30e is connected to a conduit 46a, which is connected to another secondary manifold 48. As with the other secondary manifolds, e.g., secondary manifolds 36a, 36b, 42a, 42b, the secondary manifold is connected to spray bars (not shown). Similarly, valve 30f is connected to conduit 46b, which is connected to a secondary manifold (not shown). Valve 30g is connected to conduit 50, which leads to an overflow reservoir (not shown). Thus, valve 30g functions as an overflow valve in the event of unwanted pressure within the primary manifold 22.

Disposed between each valve and its respective conduit, is a pressure sensor, sometimes, referred to as a pressure transducer. The pressure sensor is a device for pressure measurement of liquids. As is well known, pressure is an expression of the force required to stop a fluid from expanding, and is usually stated in terms of force per unit area. A typical pressure sensor acts as a transducer in that the pressure sensor generates a signal as a function of the pressure imposed. In one embodiment, the signal is an electrical signal or impulse. Pressure sensors are used for control and monitoring the pressure of fluid within the fluid management system. In some embodiments, the pressure sensors can be called pressure transducers, pressure transmitters, pressure senders, pressure indicators, piezometers and/or manometers. Some pressure sensors can be configured as pressure switches, which turn on or off at a particular pressure. For example, a water pump associated with the fluid management system can be controlled by a pressure switch so that it starts when water is released from the system, reducing the pressure in a reservoir.

As shown, a pressure sensor 52a is positioned adjacent to valve 30a to measure the pressure of fluid flowing through valve 30a, a pressure sensor 52b is positioned adjacent to valve 30b to measure the pressure of fluid flowing through valve 30b, a pressure sensor 52c is positioned adjacent to valve 30c to measure the pressure of fluid flowing through valve 30c, a pressure sensor 52d is positioned adjacent to valve 30d to measure the pressure of fluid flowing through valve 30d, a pressure sensor 52e is positioned adjacent to valve 30e to measure the pressure of fluid flowing through valve 30e, and a pressure sensor 52f is positioned adjacent to valve 30f to measure the pressure of fluid flowing through valve 30f. Thus, a pressure drop within a valve can be quickly detected by the pressure sensor associated with that valve.

The pressure sensors 52a, 52b, 52c, 52d, 52e, 52f are coupled, e.g., wirelessly, to the control module 14 to monitor the pressure of fluid within the fluid management system 20. Specifically, each pressure sensor 52a, 52b, 52c, 52d, 52e, 52f is positioned to monitor the pressure of the conduit, including spray nozzles 38, 44, associated with its respective valve. In one example, the fluid management system 20 is configured to distribute fluid a pressure between 0 psi and 120 psi. The pressure sensors 52a, 52b, 52c, 52d, 52e, 52f enable the fluid management system 20 to maintain a desired pressure through the fluid management system to control the pressure of fluid through the spray nozzles 37, 44.

The pressure sensors 52a, 52b, 52c, 52d, 52e, 52f provide closed loop feedback to the control module 14 of the pressure of fluid within the fluid management system 20. Thus, a pressure drop within one location of the fluid management system 20, e.g., secondary manifold 42a detected by pressure sensor 52c, can be immediately addressed by closing the select valves 30a, 30b, 30d, 30e, 30f within the system to increase pressure immediately at the location of the pressure sensor. Valve 30c would not be closed in the event of a pressure drop detected by pressure sensor 52c.

Figure 4:
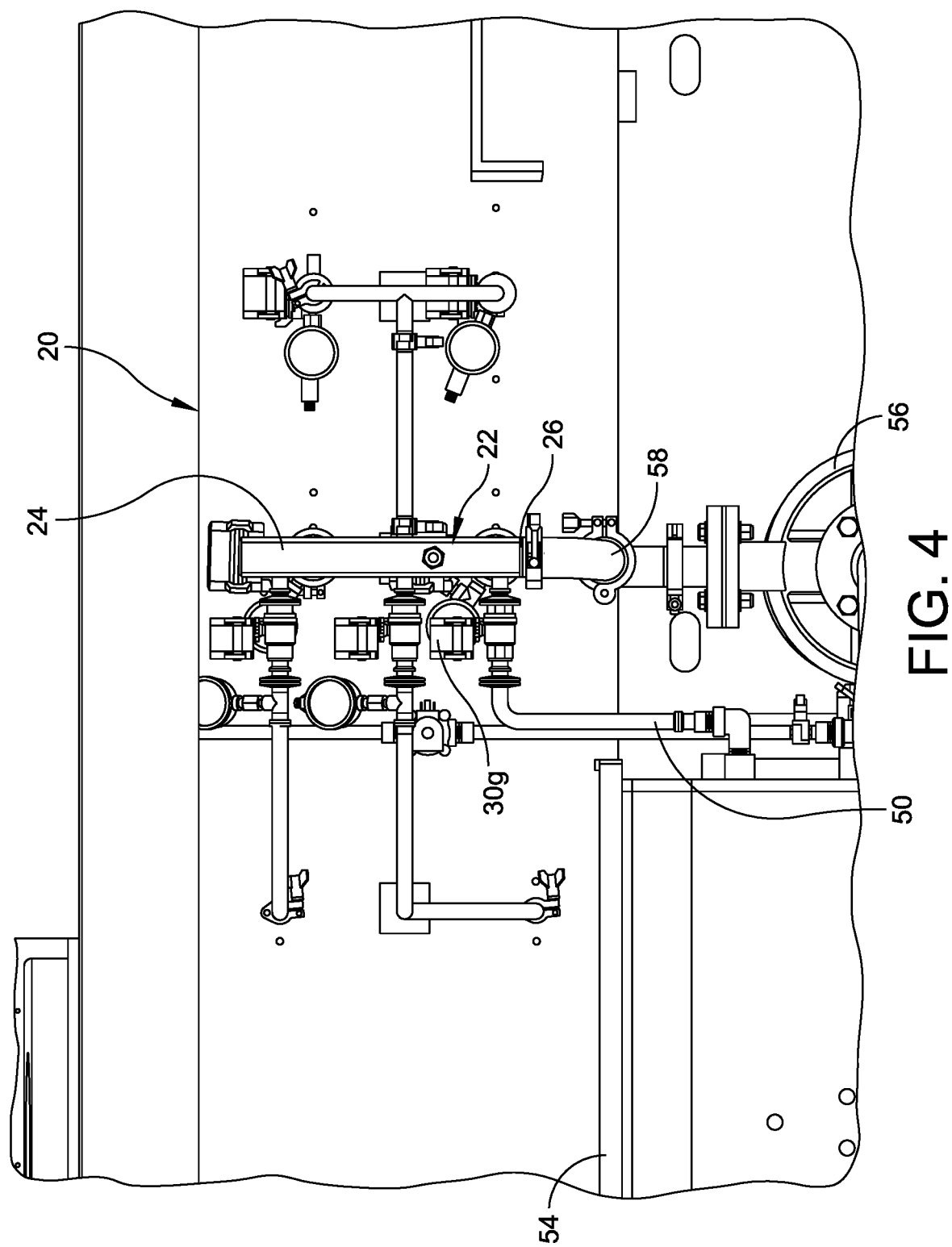
FIG. 4 is an elevational view of another portion of the fluid management system.
Figure 5:
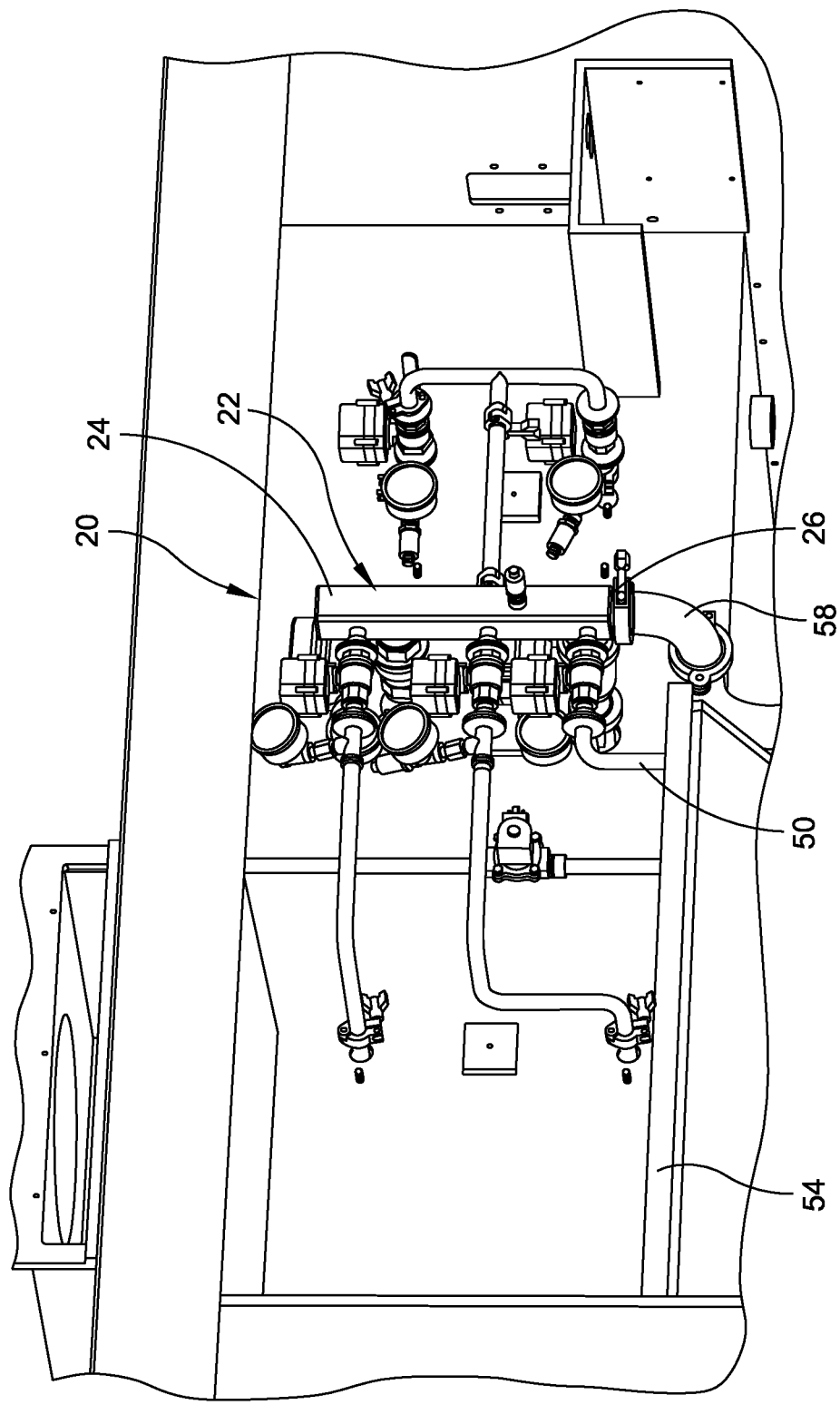
FIG. 5 is a perspective view of the portion of the fluid management system shown in FIG. 4.
Figure 6:
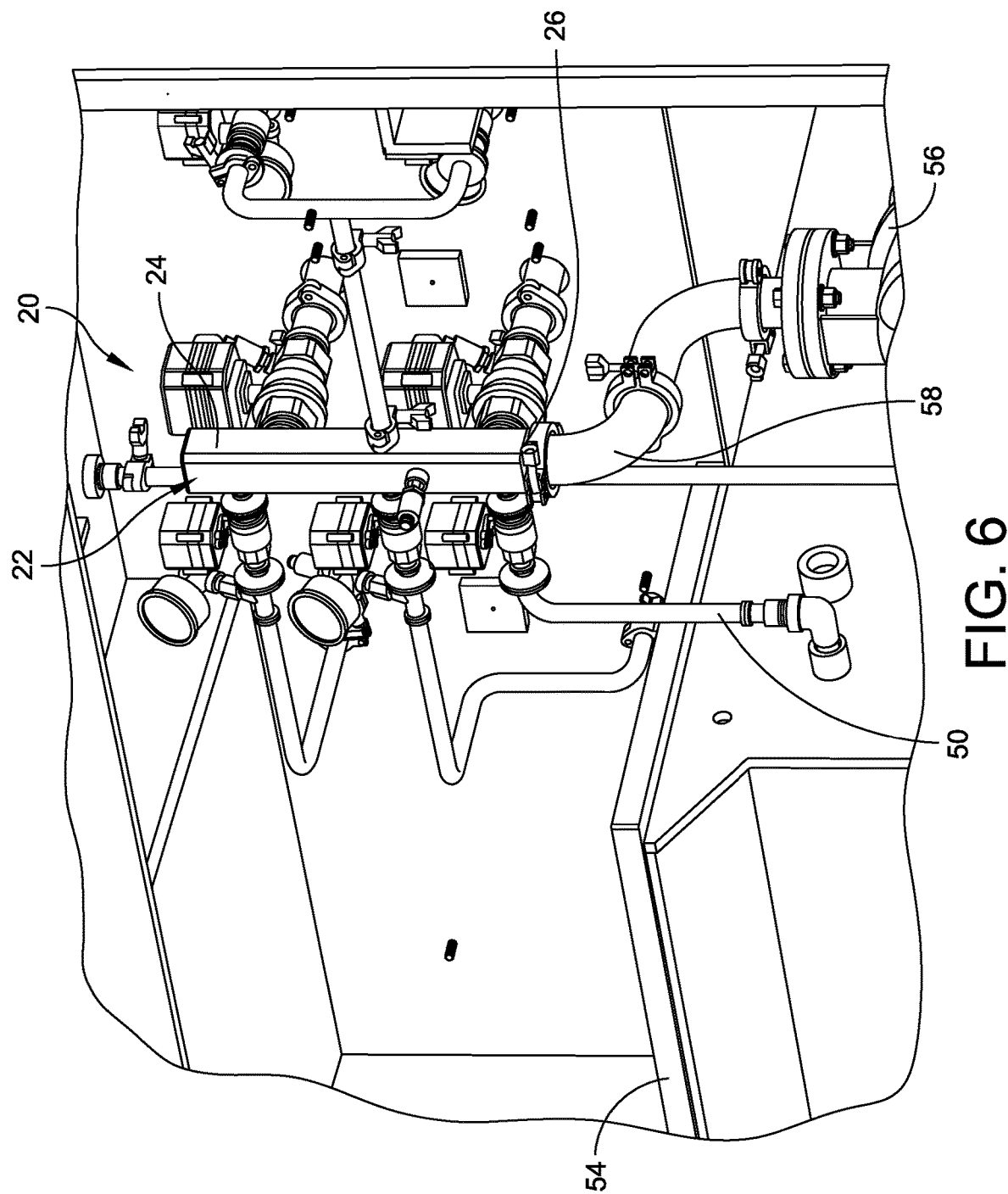
FIG. 6 is another perspective view of the portion of the fluid management system shown in FIG. 4.

Referring to FIGS. 4-6, as referenced above, the overflow valve, e.g., valve 30g, is connected to the conduit 50, which leads to a reservoir 54, Moreover, fluid is supplied to the primary manifold 22 from the reservoir 54 by a pump 56 connected to the lower end opening or inlet 26 of the manifold body 24 by conduit 58. In one embodiment, the reservoir 54 is configured to hold water or heated water, e.g., deionized water and specified chemistries.

In some embodiments, a method for cleaning electronic substrates with the cleaning apparatus is further provided. In one embodiment, the method of cleaning includes transporting electronic substrates by the conveyor system through the at least one cleaning module of the cleaning apparatus, and performing a cleaning operation on the electronic substrates. As mentioned above, the cleaning apparatus may include a pre-wash module, a wash module, a pre-rinse module, a rinse module, and a dry module. For each module including a wash function, e.g., the pre-wash, wash, pre-rinse and rinse modules, the method further includes detecting a pressure drop of a conduit of the fluid management system and adjusting one or more automatic valves associated with the conduit to address the pressure drop. Specifically, a pressure sensor associated with each valve is configured to detect a pressure of fluid flowing through the valve. In the event of a pressure drop within a certain valve, a control module of the cleaning apparatus is configured to manipulate the valves to eliminate the pressure drop. In a certain embodiment, the cleaning operation is controlled by the control module 14 of the cleaning apparatus 10.

It is to be understood that the above description is intended by way of illustration and example only and is not intended to be taken by way of limitation, and that changes and modifications are possible. For example, the cleaning apparatus 10 described above may be any type of cleaning machine that is used to clean electronic substrates. Accordingly, other embodiments are contemplated, and modifications and changes could be made without departing from the scope of this application.

In one embodiment, the control module 14 of the cleaning apparatus 10 is configured with an operating system, e.g., a Windows®-based operating system, that provides familiar pull-down menus and has data-logging and barcode capability. The operating system is easily networked for downloading of recipes and remote access to operating data. The user interface enables quick and easy viewing of system pressures, water levels, pump and blower operation, temperature, and fill/drain operation.

In one embodiment, the cleaning apparatus 10 is configured with functional modules 12 that are designed to accomplish different tasks in removing contamination. Some modules maximize flooding, while others maximize impact force for cleaning tight spaces. The cleaning apparatus 10 uses proprietary pump and nozzle technology throughout the system to optimize performance.

In one embodiment, the cleaning apparatus 10 may be configured to have appropriately sized modules and strategic manifold placement increase throughput while ensuring thorough removal of contaminants. The cleaning apparatus 10 may include perforated rails, curtain containment, and a cabinet designed to manage wash solution within the system for maximum conservation of costly chemistries. The cleaning apparatus 10 further may include a wet chemical isolation module that is powered by the recirculating rinse pump to ensure optimal pre-rinsing and to facilitate closed-loop recycling of the rinse section. An exhaust may be separated between the wash and rinse modules to minimize chemical migration through the system.

The cleaning apparatus 10 enables efficient and complete drying during a cleaning process. The cleaning apparatus 10 is configured to increase throughput, providing cost savings and return on investment.

The importance of cleaning electronic assemblies increases dramatically with lead-free soldering. Higher temperatures are required in lead-free soldering, and wetting is much more difficult. To improve "wettability," flux compositions may require higher activation. High-solid flux formulations commonly leave more undesirable residue and require cleaning.

A successful cleaning system must be able to handle the harsh demands of the lead-free process. The cleaning apparatus 10 disclosed herein may be configured with unique cleaning nozzles that provide unmatched impact force to penetrate under and around components and clean even the most challenging flux residues.

Many process parameters may be configured in a computer-controlled operator interface provided in the cleaning apparatus 10. System pressure, water levels, and temperatures are easily accessed. Data logging and barcode capability are features that enhance and streamline the production process.

In some embodiments, the cleaning apparatus 10 may be configured to include nozzles, including "jet" nozzles, to apply a maximum direct dynamic impingement to the product surface and effectively clean under low stand-off components for difficult cleaning applications. The nozzles can be configured to produce large water droplets to enhance the cleaning performance of the cleaning apparatus when operating at a lower rate of pressure. The nozzles can be configured to produce an oscillating action to better clean and flush flux residues in a prewash to reduce foaming in the recirculating wash.

In some embodiments, the cleaning apparatus 10 can be equipped with orbitally welded, stainless steel plumbing to eliminate pressure drops and leaks, all sections can be replaced or upgraded in minutes to maximize uptime and process flexibility. Plumbing sections have quick-disconnect fittings for ease of maintenance.

In some embodiments, the cleaning apparatus 10 can be configured with an optional chemical isolation (CI) module, which is a multi-section module that efficiently removes chemistry from the product prior to the rinse section. The majority of the chemistry is removed in a first section, which is close-looped back into the wash tank reservoir.

In some embodiments, the cleaning apparatus 10 can be configured to include one or more drying modules, which are integrated into a cabinet of the cleaning apparatus. Typical performance includes drying complex assemblies to within 0.1 gram of prewashed dry weight. The module reduces exhaust requirements by 44% and uses 15% less power when compared with conventional drying systems, providing a rapid return on investment.

In some embodiments, the cleaning apparatus 10 can include one or more rear panels, which can be easily removed for maintenance with the added benefit of single door removal to access the wash and rinse tanks. Front doors further can be provided to provide quick access to electrical panels, computer, heaters, floats and thermocouples. The cleaning apparatus 10 can include hinged, tempered glass windows to provide optimum viewing and access.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A cleaning apparatus for cleaning electronic substrates including printed circuit boards and semiconductor product assemblies, the cleaning apparatus comprising:
    at least one cleaning module configured to treat electronic substrates; and
    a conveyor system configured to transport the electronic substrates through the at least one cleaning module,
    the at least one cleaning module including a fluid management system having
        a manifold coupled to a source of fluid, the manifold including at least one outlet,
        an automatic valve coupled to the at least one outlet and to a conduit leading to one or more first spray nozzles, and
        a pressure sensor coupled to the automatic valve, the pressure sensor being configured to measure pressure of fluid flowing through the conduit,
        wherein the automatic valve is configured to adjust the flow of fluid through the conduit based on the pressure measured by the pressure sensor.

2. The cleaning apparatus of claim 1, further comprising a controller coupled to the automatic valve and the pressure sensor.

3. The cleaning apparatus of claim 2, wherein the manifold includes at least two outlets, a first outlet and a second outlet.

4. The cleaning apparatus of claim 3, wherein the fluid management system further includes a first automatic valve coupled to the first outlet and to a first conduit leading to one or more first spray nozzles and a second automatic valve coupled to the second outlet and to a second conduit leading to one or more second spray nozzles.

5. The cleaning apparatus of claim 4, wherein the fluid management system further includes a first pressure sensor coupled to the first automatic valve and a second sensor coupled to the second automatic valve, the first pressure sensor being configured to measure pressure of fluid flowing through the first conduit and the second pressure sensor being configured to measure pressure of fluid flowing through the second conduit.

6. The cleaning apparatus of claim 5, wherein the controller is configured to control the first and second automatic valves to address a pressure drop detected by one of the first pressure sensor and the second pressure sensor.

7. The cleaning apparatus of claim 6, wherein a pressure drop detected by the first pressure sensor results in a closing or partially closing of the second automatic valve.

8. A cleaning apparatus for cleaning electronic substrates including printed circuit boards and semiconductor product assemblies, the cleaning apparatus comprising:
    at least one cleaning module configured to treat electronic substrates; and
    a conveyor system configured to transport the electronic substrates through the at least one cleaning module,
    the at least one cleaning module including a fluid management system having
        a manifold coupled to a source of fluid, the manifold including at least two outlets, a first outlet and a second outlet,
        a first automatic valve coupled to the first outlet and to a first conduit leading to one or more first spray nozzles and a second automatic valve coupled to the second outlet and to a second conduit leading to one or more second spray nozzles, and
        a first pressure sensor coupled to the first automatic valve and a second sensor coupled to the second automatic valve, the first pressure sensor being configured to measure pressure of fluid flowing through the first conduit and the second pressure sensor being configured to measure pressure of fluid flowing through the second conduit,
        wherein at least one of the first automatic valve and the second automatic valve is configured to adjust the flow of fluid through its respective conduit based on the pressure measured by one of the first pressure sensor and the second pressure sensor.

9. The cleaning apparatus of claim 8, further comprising a controller coupled to the first and second automatic valves and the first and second pressure sensors.

10. The cleaning apparatus of claim 9, wherein the controller is configured to control the automatic valves to address a pressure drop detected by one of the first pressure sensor and the second pressure sensor.

11. The cleaning apparatus of claim 10, wherein a pressure drop detected by the first pressure sensor results in a closing or partially closing of the second automatic valve.

12. A method for cleaning electronic substrates with the cleaning apparatus of claim 8, the method comprising:
    transporting an electronic substrate by the conveyor system through the at least one cleaning module;
    performing a cleaning operation with the at least one cleaning module;

detecting a pressure drop of one of the first conduit and the second conduit; and adjusting one of at least two automatic valves associated with the first conduit and the second conduit, respectively, to address the pressure drop.

13. A fluid management system of a cleaning module of a cleaning apparatus to clean electronic substrates including printed circuit boards and semiconductor product assemblies, the fluid management system comprising:

a manifold coupled to a source of fluid, the manifold including at least one outlet;

an automatic valve coupled to the at least one outlet and to a conduit leading to one or more first spray nozzles; and a pressure sensor coupled to the automatic valve, the pressure sensor being configured to measure pressure of fluid flowing through the conduit, wherein the automatic valve is configured to adjust the flow of fluid through the conduit based on the pressure measured by the pressure sensor.

14. The fluid management system of claim 13, wherein a controller is coupled to the automatic valve and the pressure sensor.

15. The fluid management system of claim 14, wherein the manifold includes at least two outlets, a first outlet and a second outlet.

16. The fluid management system of claim 15, further comprising a first automatic valve coupled to the first outlet and to a first conduit leading to one or more first spray nozzles and a second automatic valve coupled to the second outlet and to a second conduit leading to one or more second spray nozzles.

17. The fluid management system of claim 16, further comprising a first pressure sensor coupled to the first automatic valve and a second sensor coupled to the second automatic valve, the first pressure sensor being configured to measure pressure of fluid flowing through the first conduit and the second pressure sensor being configured to measure pressure of fluid flowing through the second conduit.

18. The fluid management system of claim 17, wherein the controller is configured to control the first and second automatic valves to address a pressure drop detected by one of the first pressure sensor and the second pressure sensor.

19. The fluid management system of claim 18, wherein a pressure drop detected by the first pressure sensor results in a closing or partial closing of the second automatic valve.

20. The fluid management system of claim 13, further comprising an overflow valve to evacuate fluid from the manifold in the event of an overflow situation.

* * * * *